Oct. 8, 1968 D. E. MILLER 3,405,287

AVALANCHE TRANSISTOR PULSE GENERATOR

Filed Nov. 2, 1965

INVENTOR
D. E. MILLER
BY John K. McCarney
ATTORNEY

United States Patent Office 3,405,287

Patented Oct. 8, 1968

3,405,287

AVALANCHE TRANSISTOR PULSE GENERATOR

David E. Miller, Greensboro, N.C., assignor to Bell Telephone Laboratories, Incorporated, New York, N.Y., a corporation of New York Filed Nov. 2, 1965, Ser. No. 506,050
6 Claims. (Cl. 307—268)

ABSTRACT OF THE DISCLOSURE

An avalanche transistor is connected in an emitter follower configuration with a pulse forming coaxial transmission line connected in the collector path thereof to provide for energy storage. Another section of coaxial transmission line is connected in the emitter path and is of a length such as to present a pure resistive impedance regardless of the output terminating load. The two sections of coaxial line comprise a single length of coaxial cable with a small section of the center conductor thereof removed to coaxially receive the transistor. The connection to the collector is made via the transistor case to which the collector is internally connected, the case being disposed in a reamed hole in the center conductor of the first section of the cable. A short emitter lead bridges the small gap to the center conductor of the second section. The base connection is made through a small hole in the outer conductor. The collector resistor is also mounted coaxially in the cable at the end remote from the collector and it is of a value such as to provide a reflection coefficient that is real and very nearly one.

This invention relates to pulse generators and more particularly to an avalanche transistor pulse generator designed to produce high amplitude pulses with subnanosecond rise and fall times at repetition rates of one megacycle and more.

Numerous prior art pulse generating circuits employ an energy storage device in the pulse forming network and a switching element bridged across the pulse forming network to intermittently provide a discharge path for the stored energy in order to produce pulses across a load device. With the advent of high speed circuit requirements, it has been found advantageous to employ, as the switching element of a pulse generator, a solid state device such as a transistor which is rapid in operation. More specifically, the avalanche transistor has proven to be very well suited for such use. Avalanche transistor circuits are extremely fast acting, they offer large voltage and charge gains and they exhibit minimum temperature sensitivity.

Avalanche transistors have worked so well in pulse generating circuits that the operating speed of the switching element is no longer the limiting factor on pulse rise and fall times or pulse repetition rate. Rather, the limiting factors are those associated with the circuitry connected to the switch. To illustrate, suppose the avalanche transistor is simply connected to the pulse forming network by wire leads (e.g., see the patent Kagan et al. 2,986,657). Now while the pulse forming network might be capable of establishing a constant current almost instantaneously if it is suddenly terminated in a resistive load, the inductance of the leads in this case forces the current to build up exponentially to its peak value. Further, it is known that the typical load resistance has some amount of stray series inductance which likewise impedes current buildup. It is these factors, typified by the above examples, that limit pulse rise and fall times, pulse definition, pulse repetition rate, et cetera.

It is accordingly an object of the present invention to provide a pulse generator circuit that is capable of delivering energy to a load substantially as fast as an avalanche transistor switch can pass it.

A more general object of the invention is to generate large amplitude, well defined pulses with subnanosecond rise and fall times at extremely high repetition rates.

A further object is to minimize the parasitic inductance in the discharge path of an avalanche transistor so that the only impedance to the sudden establishment of a large current in the load is that which is inherent in the transistor switch.

These and other objects are obtained in accordance with the present invention wherein an avalanche transistor has a pulse forming coaxial transmission line connected in the collector path thereof to provide for energy storage. Another section of coaxial transmission line is connected in the emitter path and is of a length such as to present a pure resistive impedance for the duration of the generated pulse regardless of the output terminating load connected thereto. The two sections of coaxial line comprise a single length of an air dielectric coaxial cable with a small segment of the center conductor thereof removed to coaxially receive the transistor. The connection to the collector is made via the transistor case to which the collector is internally connected, the case being disposed in a reamed hole in the center conductor of the first section of the cable. A short emitter lead bridges the small gap to the center conductor of the second section. The base connection is made through a small hole in the outer conductor of the cable. The collector resistor is also mounted coaxially with the center conductor in a housing which is designed to provide a real reflection coefficient; the collector resistor is of a value such as to further provide a reflection coefficient that is very nearly one.

The pulse generator configuration described above minimizes the discontinuity between the pulse forming line and the output transmission line when the transistor switches to its avalanche mode. In addition, the aforementioned parasitic inductance effects are substantially eliminated.

Other objects and features of the invention will be more readily understood from the following detailed description taken in conjunction with the accompanying drawing in which.

Figure 1:
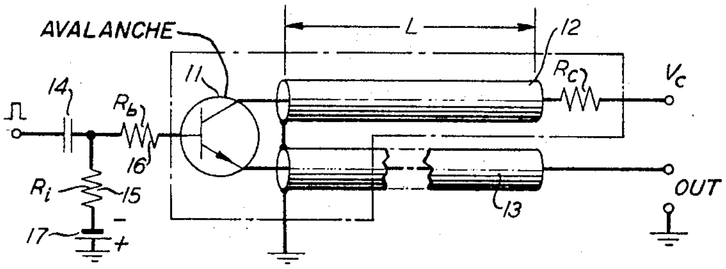
FIG. 1 is a schematic circuit diagram of a pulse generator circuit in accordance with the invention, the portion of the circuit enclosed by the dashed lines being structurally illustrated in FIG. 2.

Referring now to FIG. 1 of the drawing, there is shown a pulse generator comprising an avalanche transistor 11 having a section of coaxial transmission line 12 connected in the collector path thereof as well as another section of coaxial transmission line 13 connected in the emitter path. The transistor 11 may advantageously be of the type described, for example, by J. J. Ebers and S. L. Miller in the article "Alloyed Junction Avalanche Transistors," Bell System Technical Journal, Vol. 34, September 1955, page 883. Briefly, the operation of an avalanche transistor is closely analogous to the operation of a gaseous dicharge vacuum tube. By maintaining a high collector-to-emitter voltage, there is a strong electric field maintained within the transistor, the space charge layer is widened, and there is an increase in the number of carrier electrons and holes. Under quiescent conditions, i.e., when the voltage applied to the collector is slightly less than the breakdown potential, there is a small collector current flow ($I_{co}$). Now if the collector voltage is increased to the point where the base current is sufficient to forward bias the emitter junction, or, as in the present case, if that is accomplished by an external trigger pulse applied to the base, the resulting current flow supplies carriers to the collector junction which avalanches heavily. During the so-called avalanche condition, a very high current flows in the collector-emitter path. Once triggered, the transistor will remain in the avalanche condition until the energy storage elements in the circuit have discharged and the current has reduced to a low level. The state of the transistor then returns to its pretriggered condition and awaits the next trigger pulse. Since avalanche transistors and their mode of operation have been described extensively in the literature, the foregoing brief description should suffice for present purposes.

In general, the operation of the circuit of FIG. 1 is typical of the avalanche transistor type of discharge pulse generators. Before the transistor avalanches, the pulse forming line 12 is charged to a potential V whose relationship to the collector potential source $V_c$ is determined by the collector resistance $R_c$ and the quiescent current flow in the transistor. When the transistor is triggered into avalanche, the energy stored in the pulse forming line (PFL) is discharged into the output transmission line 13 which preferably is terminated in a matched load. As will be evident to those skilled in the art, the output pulse duration is determined by the electrical length (L) of the PFL and it is equal to 2L. That is, avalanche is maintained for the time required for the voltage wave front associated with the PFL to travel from the collector end of the line to the remote open end, reflect from the open end and then return to the collector end. The reflected or returned wave front drops the collector voltage abruptly and thus extinguishes the avalanche process. Accordingly, in this arrangement the collector resistor is not depended upon to "starve" the transistor at the end of the pulse period.

Any resistance load has some amount of stray series inductance, which impedes current buildup. To circumvent this, a section of transmission line 13 is utilized to couple the discharge pulses to the load. A transmission line presents a purely resistive impedance, regardless of its termination, for a period of time required by a wave to travel twice its length. Thus, if an arbitrary unmatched load is separated from the transistor emitter by a sufficient length of transmission line, the generator will see a purely resistive load for the duration of the output pulse period. To this end, for an unmatched load situation, the transmission line 13 should be of a length somewhat greater than L. With this length line, the size of the output load can in general be disregarded.

The trigger pulses, from a source not shown, are coupled to the base circuit via capacitor 14. The resistance 15 ($R_i$) matches the trigger source impedance, and with capacitor 14 it provides a differentiation function. The base resistance 16 ($R_b$) serves to isolate the trigger circuit. The bias source 17 delivers a small reverse bias to the base-emitter junction to stabilize the quiescent operating point. Dimension and element values are not specified as they will, of course, depend upon the requirements specified for a particular application.

The duration of the trigger pulse is immaterial so long as it terminates sometime before the next pulse is to be generated. That is, it can be longer or shorter than the output pulse, and typically it will be somewhat longer than the same. Once avalanche is initiated the base loses control over circuit operation.

If the advantages of the avalanche transistor switch are to be fully exploited, the circuitry associated with the switch must be able to deliver the energy to the load at least as fast as the switch can pass it. To illustrate, suppose that the avalanche transistor is simply connected to the pulse forming transmission line by wire leads. Although the charged transmission line is capable of establishing a constant current almost instantaneously if it is suddenly terminated in a resistive load, the inductance of the leads in this case forces the current to build up exponentially to its peak value.

Now in accordance with the principles of the present invention a pulse generator configuration is provided which reduces to an absolute minimum the parasitic inductance effects in the discharge path so that only the transistor itself offers any hindrance to the sudden establishment of a current in the load. This configuration also minimizes the discontinuity between the PFL and the output transmission line when the transistor switches to its avalanche mode. The ability of a transistor operating in this mode to make large voltage swings in subnanosecond intervals is thus fully exploited.

Figure 2:
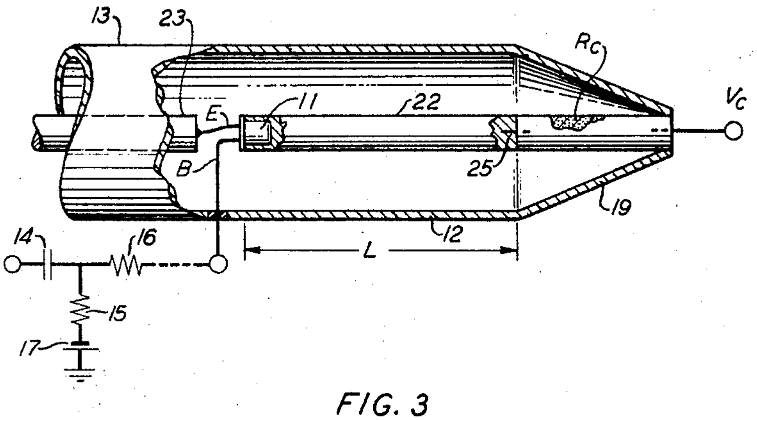
FIG. 2 is a side elevation view, partly in section of the coaxial cable with the avalanche transistor shown coaxially mounted therein.

The pulse generator configuration of the present invention is structurally illustrated in FIG. 2 of the drawing. The structural showing of FIG. 2 corresponds to that portion of the FIG. 1 schematic enclosed by the dashed lines. The two lengths of coaxial transmission line 12 and 13, respectively, comprise a single length of rigid, air dielectric, coaxial cable with a small segment of the center conductor thereof removed, as shown in FIG. 2. The center conductor 22 that comprises part of the coaxial line 12 has a hole machined in the end thereof which coaxially receives the transistor 11. This bored hole is preferably one or two mils smaller than the transistor case diameter to ensure good electrical contact. The collector of the transistor is connected internally to the transistor case and hence it is possible to completely eliminate the collector lead. It is commonplace in the art to internally connect the collector to the case. For example, the National Semiconductor NS 1110 is an avalanche transistor with such an interconnection. The gap between the center conductors 22 and 23 is kept as small as possible, with the short emitter lead bridging the gap to connect the center conductor 23 of transmission line section 13. The gap should be just large enough (e.g. one-eighth of an inch) to prevent the base lead from shorting to either center conductor. Connection to the base is made through a small hole in the outer conductor of the cable.

The gap noted above presents a small but inevitable discontinuity. The effects of this discontinuity are minimized, however, by keeping the gap as small as possible.

The trailing edge of the output pulse is determined by a traveling wave reflected from the end of the pulse forming line. However, since the line must be charged between pulses, it is not possible to leave this end open-circuited as it theoretically should be. These seemingly contradictory requirements are satisfactorily met by the mounting arrangement illustrated in FIG. 2. The collector resistor $R_c$ is also mounted coaxially with the center conductor in a truncated conical housing 19. The short pigtail lead 25 of the carbon composition type resistor is forced into a small hole drilled in the end of the center conductor 22. The other end of the resistor $R_c$ is supported by the housing 19. Such support is permissible since the composition material of the resistor is not a conductor.

The coaxial housing 19 is gradually tapered so as not to introduce any abrupt discontinuities which could create possible distortions in the reflected wavefront. The collector resistance $R_c$ should be sufficiently large to provide a reflection coefficient approaching unity or one. Yet, $R_c$ must be low enough to permit a reasonable repetition rate. With the mounting design illustrated in FIG. 2 and a collector resistance of 25K ohms a "real" (i.e., the reflected wave is a replica of the incident wave) reflection coefficient of very nearly one was obtained at repetition rates in excess of one megacycle.

In addition to the previously noted advantages of this mounting configuration, increase shielding from extraneous circuit noise and the like is also provided. Thus, the pulse forming network is essentially free from outside interference.

The pulse produced by the pulse generator illustrated in FIGS. 1 and 2 is very well defined. Its rise and fall times are limited primarily by the transistor and duration can be changed, within the limits of transistor dissipation capability, by changing the length L of the PFL. Amplitude is limited only by the transistor breakdown voltage and it can be increased by using units in series or by incorporating avalanche transistors designed for higher breakdown. A pulse generator constructed in accordance with the invention generated output pulses of 1.5 nanoseconds duration with rise and fall times of 0.4 nanosecond and less, and amplitudes up to 45 volts at repetition rates in excess of one megacycle.

Figure 3:
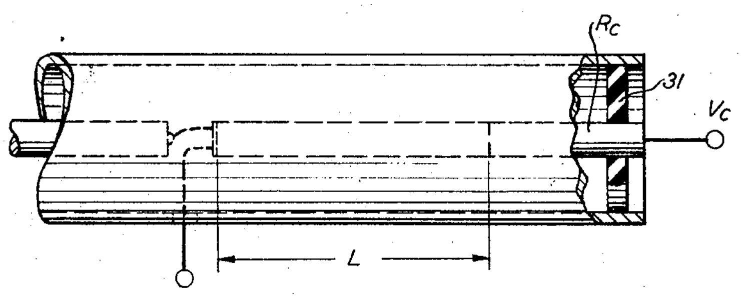
FIG. 3 is a side elevation view, partly in section, of a modification of the FIG. 2 structural arrangement.

An alternative embodiment is illustrated in FIG. 3 of the drawing. In this arrangement the conical housing 19 is eliminated and the outer conductor of the coaxial cable is simply extended as shown. The collector resistor $R_c$ is supported at the outer extremity by the polyethylene spacer 31. In all other respects this structural arrangement is similar to that of FIG. 2.

While the transistor employed has been shown and described as an n-p-n junction transistor, it is obvious that a p-n-p junction transistor is equally suitable so long as the polarities of the potential sources and the applied trigger pulse are reversed. It is to be understood, therefore, that the foregoing disclosure relates only to preferred embodiments of the invention and that numerous modifications or alterations may be made therein without departing from the spirit and scope of the invention.

What is claimed is:

1. A pulse generator comprising an avalanche transistor having a collector, an emitter and a base, a pulse forming coaxial transmission line connected in the collector path of said transistor, another section of coaxial transmission line connected in the emitter path of said transistor and of a length such as to present for the duration of the pulse period a pure resistive impedance as seen from the emitter, the two sections of transmission line comprising a single length of air dielectric coaxial cable with a small segment of the center conductor thereof removed to define a small gap between separate sections of the center conductor, said separate center conductor sections defining the two aforementioned sections of transmission line, said transistor being disposed in a recessed hole in the gap end of the center conductor section that defines the pulse forming coaxial transmission line, the emitter lead of said transistor bridging the gap to connect to the other center conductor section, and a collector resistance mounted coaxially with the center conductor of the cable at the remote end of the center conductor section in which the transistor is disposed, the collector resistance being of a value such as to provide a reflection coefficient substantially equal to one.

2. A pulse generator as defined in claim 1 wherein the emitter path coaxial transmission line is longer in length than the pulse forming coaxial transmission line.

3. A pulse generator as defined in claim 1 wherein said collector resistance is mounted in a conical housing designed to insure a substantially real reflection coefficient.

4. A pulse generator as defined in claim 1 wherein bias potential is applied to the collector of said transistor via the collector resistance, the center conductor section in which the transistor is disposed and the transistor case, the collector being internally connected to said case.

5. A pulse generator as defined in claim 4 wherein the base lead extends through a small hole in the outer conductor of the cable.

6. In combination, an avalanche transistor having a collector, an emitter and a base, a pulse forming coaxial transmission line connected in the collector path of said transistor, another section of coaxial transmission line connected in the emitter path of said transistor and of a length greater than that of the pulse forming line, the two sections of transmission line comprising a single length of air dielectric coaxial cable with a small segment of the center conductor thereof removed to define two center conductor sections, the center conductor section that comprises part of the pulse forming coaxial line having a coaxial hole in the inner end thereof to coaxially receive the avalanche transistor, said transistor having its collector internally connected to the transistor case and being thus connected to said center conductor via said case, the emitter lead bridging the small segment or gap to connect to the other center conductor section that comprises part of the emitter path coaxial transmission line, connection to the base lead being made through a small hole in the outer conductor of the cable, and a collector resistance mounted coaxially with the center conductor of the cable in a gradually tapered conical housing, the collector resistance being mounted at the end of the pulse forming line section remote from the transistor and in electrical contact with the center conductor section, the collector resistance being of a value such as to provide a reflection coefficient nearly equal to one.

References Cited

UNITED STATES PATENTS 3,141,981 7/1964 Henebry ---------- 307—88.5

ARTHUR GAUSS, *Primary Examiner.*

J. ZAZWORSKY, *Assistant Examiner.*